(12) United States Patent
Cronquist

(10) Patent No.: US 7,107,568 B2
(45) Date of Patent: Sep. 12, 2006

(54) SYSTEM AND METHOD FOR REDUCING WIRE DELAY OR CONGESTION DURING SYNTHESIS OF HARDWARE SOLVERS

(75) Inventor: Darren C. Cronquist, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 708 days.

(21) Appl. No.: 10/266,719

(22) Filed: Oct. 7, 2002

(65) Prior Publication Data

US 2004/0068331 A1 Apr. 8, 2004

(51) Int. Cl.
G06F 17/50 (2006.01)
G06F 9/45 (2006.01)

(52) U.S. Cl. .............................. 716/18; 716/3; 717/146

(58) Field of Classification Search .................. 716/18, 716/3; 717/146
See application file for complete search history.

(56) References Cited

U.S. PATENT DOCUMENTS

| | | | |
|---|---|---|---|
| 6,075,935 A | 6/2000 | Ussery et al. | |
| 6,226,776 B1* | 5/2001 | Panchul et al. | 716/3 |
| 6,314,552 B1* | 11/2001 | Markov | 716/18 |
| 6,397,341 B1* | 5/2002 | Genevriere | 713/400 |
| 6,438,739 B1 | 8/2002 | Yamada | |
| 6,557,158 B1* | 4/2003 | Nishida | 716/18 |
| 6,625,797 B1* | 9/2003 | Edwards et al. | 716/18 |
| 6,782,511 B1* | 8/2004 | Frank et al. | 716/1 |
| 6,829,756 B1* | 12/2004 | Trimberger | 716/6 |
| 6,848,085 B1* | 1/2005 | Panchul et al. | 716/3 |
| 6,925,628 B1* | 8/2005 | Ogawa et al. | 716/18 |
| 6,941,541 B1* | 9/2005 | Snider | 716/18 |
| 6,952,816 B1* | 10/2005 | Gupta et al. | 716/18 |
| 2001/0016936 A1* | 8/2001 | Okada et al. | 716/18 |
| 2001/0034876 A1* | 10/2001 | Panchul et al. | 716/18 |
| 2002/0138816 A1 | 9/2002 | Sarrafzadeh et al. | |
| 2002/0188923 A1* | 12/2002 | Ohnishi | 716/18 |
| 2004/0068711 A1* | 4/2004 | Gupta et al. | 716/18 |

OTHER PUBLICATIONS

S, Dey et al—"Exploiting Hardware Sharing in High-Level Synthesis for Partial Scan Optimization"—IEEE/ACM Int'l Conferencer on Computer Aided Design—Nov. 11, 1993—Conf 11—pp. 20-25.

Terry Tao Ye et al—"Data Path Placement With Regularity"—IEEE/ACM Int'l Conference on Computer-Aided Design—Nov. 5, 2000 pp. 264-270.

Moonwook Oh et el—"Rate Optimal VLSI Design From Data Flow Graph"—Desgin Automation Conference Proceedings—Jun. 15. 1998—pp. 118-121.

J H Panner et al—"A 300 K-Circuit ASIC Logic Family CAD System"—IEEE Custom Integrated Circuit Conference—May 13, 1990—pp. 10.4.1-10.4.5.

S Bara et al—"Ultra-Fast Poisson's Equation Solvers Using Wired-Up Processors for Virtual Devices Architectures"—Proceedings Semiconductor Conference—Oct. 1999—pp. 249-252.

* cited by examiner

Primary Examiner—Stacy A Whitmore

(57) ABSTRACT

One embodiment of the invention is a method for producing a hardware solver for intermediate code comprising analyzing intermediate code for at least one instantiation that may cause at least one of wire delay and congestion in the solver, forming compensation for the at least one instantiation, and forming the solver in accordance with the compensation.

47 Claims, 12 Drawing Sheets

$$FIG.\ 7B \begin{cases} A=...\quad 701 \\ B=...A... \\ C=...A... \\ D=...A... \\ E=...A... \end{cases}$$

$$FIG.\ 7D \begin{cases} A=...\quad 701 \\ F=A\quad 705 \\ B=...F... \\ C=...F... \\ D=...A... \\ E=...A... \end{cases}$$

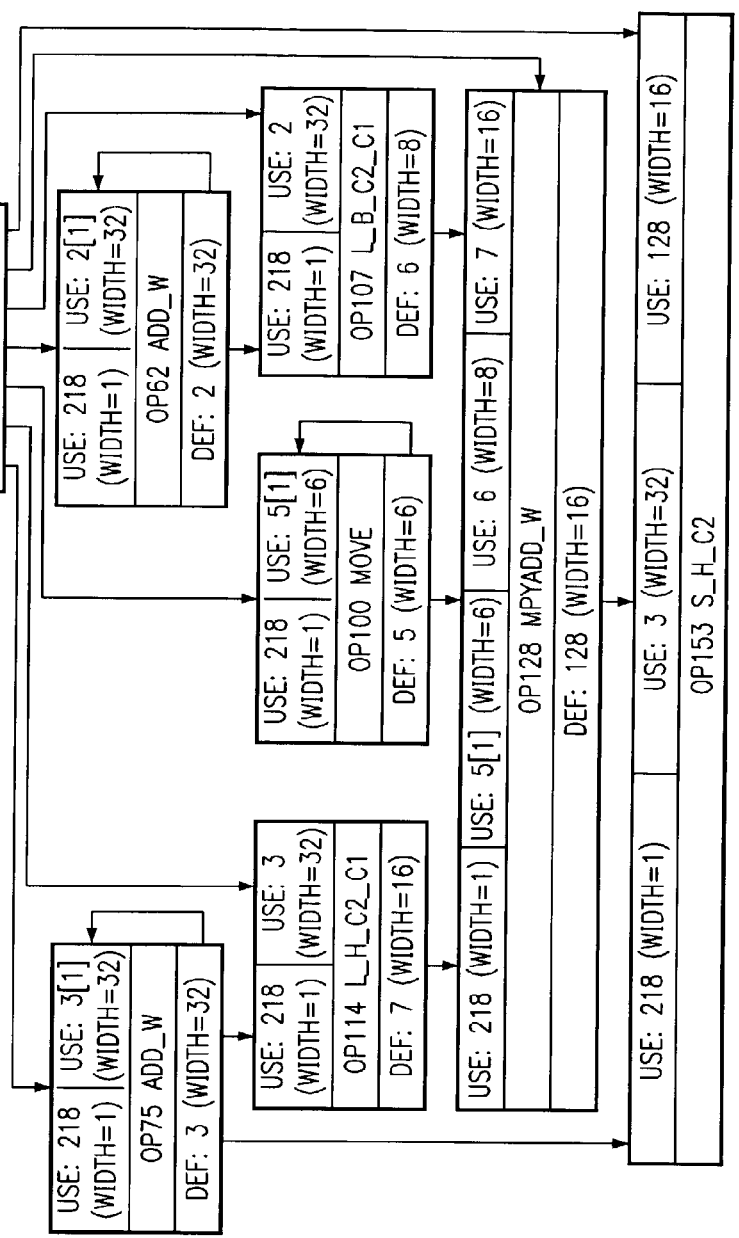

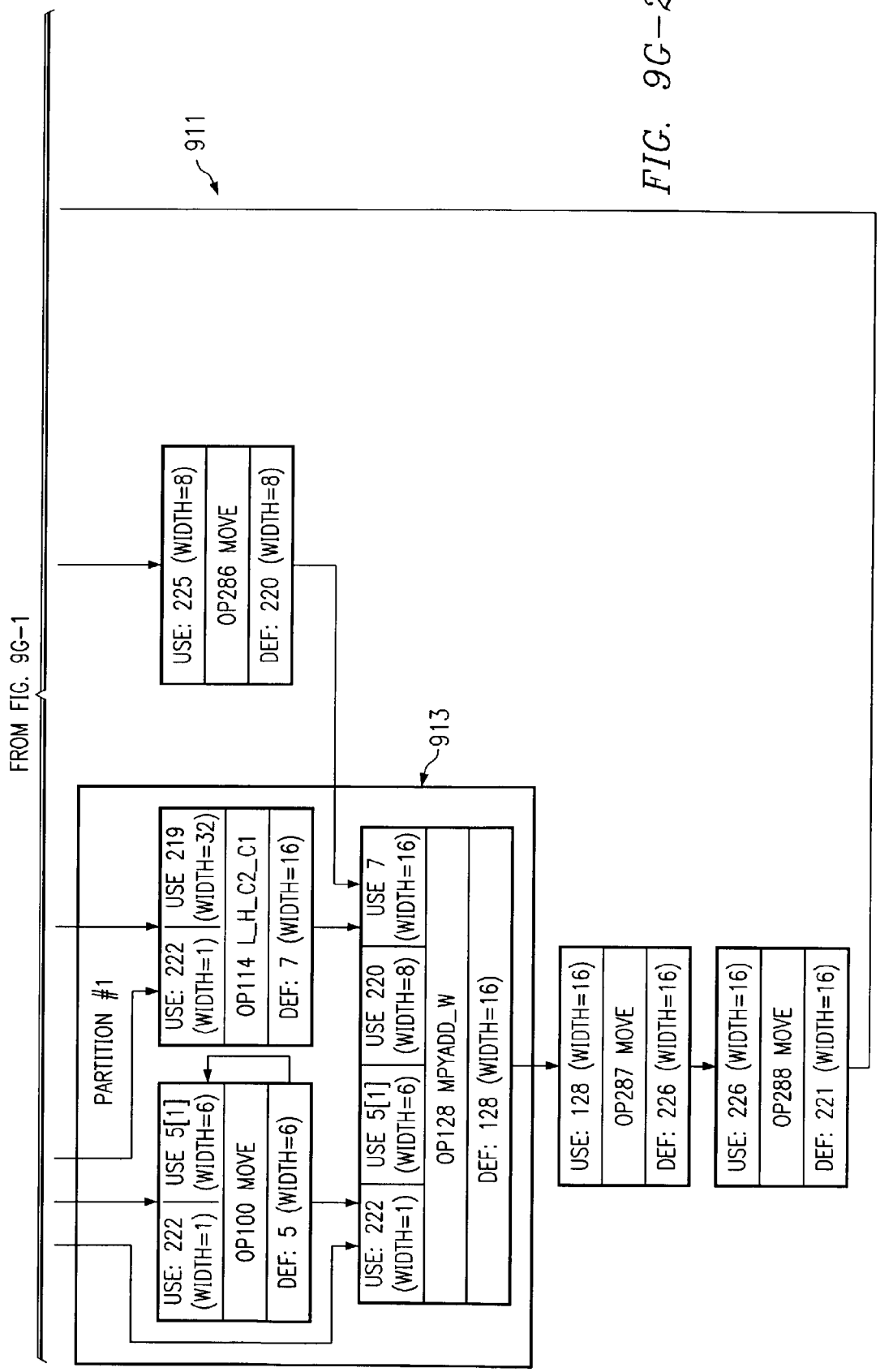

SYSTEM AND METHOD FOR REDUCING WIRE DELAY OR CONGESTION DURING SYNTHESIS OF HARDWARE SOLVERS

FIELD OF THE INVENTION

This invention relates in general to computer systems and in specific to a system and method for reducing wire delay and/or congestion in hardware solvers.

DESCRIPTION OF THE RELATED ART

Design automation is the process of taking a computer program, written in a high-level language, such as C, and producing a hardware circuit with the same functionality as the computer program. In other words, code from a program is converted into compute devices (such multipliers and adders) to perform the program's computation, memory devices (such as registers and RAM) to store the program's data, and control devices (such as finite-state-machines and microcontrollers) to execute the program's instructions. The hardware circuit resulting from design automation is specified at the register-transfer-level (RTL), which is a cycle-level structural description of the all of the hardware. Once this "C-to-RTL" automation is complete, physical design maps the RTL onto a physical backend target such as field-programmable-gate-arrays (FPGAs) or standard cells.

FIG. 1 depicts a flow chart 100 for processing a program into a chip design. The flow chart 100 begins with a computer program 101, which is processed by compiler 102 into intermediate code 103. The compiler performs typical compiler operations such as control flow analysis, data flow analysis, iteration scheduling, etc. The compiler may also perform optimizations such as dead code elimination, strength reduction, etc. The intermediate code 103 is then processed through functional unit (FU) allocation, scheduling, and hardware (HW) synthesis 104.

In FU allocation 104, logical devices, e.g. adders, multipliers, etc., are selected to perform the instructions of the intermediate code 103. The amount of logical devices allocated is typically the minimum needed to perform the tasks within a target performance. Performance is typically measured in terms of the loop initiation interval (II). II is the number of cycles available to execute an iteration of the loop. If II>1, then sharing of hardware may be possible. For example, if II=2 and there are two ADD operations in an iteration, then it might be possible to execute both operations on the same physical adder. In general, FU allocation will allocate the fewest resources possible to execute the operations for a given II.

During scheduling, the operations of the intermediate code are scheduled onto the selected functional units at particular time intervals. During HW synthesis, the selected functional units are instantiated as hardware components and connected together according to the schedule into a hardware circuit with the same functionality of the program 101. The result is a netlist 105 that is a register-level view of the hardware circuit. During physical design 106, the netlist goes through technology mapping, floorplanning, place and route, timing convergence, and (if necessary) mask generation. The result is hardware 107 for the target technology that has the functionality of the program 101. For example, the result for an FPGA-target could be a bit file that is downloaded into the FPGA fabric. For a standard-cell technology, the result would be a set of masks that are ready for fabrication into silicon.

A particular use for this process is to form a hardware accelerator that performs the functions of a nested loop of code. The accelerator is a non-programmable piece of hardware that efficiently performs the functions of a portion of code, which is typically a nested loop. Nested loop code can be very time consuming to process, as inner loops must be processed repeatedly for each increment of an outer loop. Thus, a hardware accelerator can very quickly perform the same task for the price of a small amount of chip area.

The hardware solver produced by the design automation process is described structurally in a hardware description language (HDL). This description is also referred to as a register-transfer-level (RTL) description. The RTL description specifies how components such as registers, adders, RAM, mutliplexers, etc., are connected to each other. These connections are called nets. An RTL description defines a set of nets, and hence is also called a netlist. FIG. 2 is an example of a netlist 105. A net is a set of connections between one output terminal and multiple input terminals. An input terminal is a one bit input to a device (such as a register, multiplier, adder, etc.). An output terminal is a one bit output from a device. For example, FIG. 2 depicts a plurality of functional units 201, and one net 202. Note that only one net is shown for the sake of simplicity, as the additional nets would exist. The net includes an input terminal 203 and a plurality of output terminals 204. In this example the input terminal 203 is one bit of output from a register. Note physical properties of a net, such as its length, delay, or effect on congestion are not described in a netlist.

In the design automation process, it is often important to meet a given performance target. To meet performance, the hardware solver must be able to run at a certain clock speed. This means that the delay of any register to register path must be within the clock period. For example, a 100 MHz clock has a clock period of 10 ns. Say that a path in the netlist goes from the output of a register (1 ns) through an adder (4 ns) through a multiplexer (2 ns) and to the input of a register (1 ns). The total delay of this path, not counting wire delay, is 8 ns. If the wire delay associated with this path is within 2 ns, then this path meets timing. The problem is that the wire delay will not be known until after the backend physical design process.

Some existing design automation methods handle wire delay by over-designing the hardware solver during 104 in order to leave room for wire delay. The amount of the clock period that is left "on the table" for wire delay is called the wiring slack, routing slack, or just slack. The problem is that there is a large variability of wire delay from circuit to circuit. One solver may need 10% of the clock period for wire delay, while another solver may need 20%. Predicting this can be difficult since the delay of each wire depends on the placement of components and the contention for routing resources during backend physical design.

One way to handle the wire delay variability is to be aggressive during 104 and leave a small amount of wire slack, and then if backend physical design fails, generate a new hardware solver with a different slack target. This method is expensive in design time since backend physical design is a very time consuming process. Another method is to be conservative and leave enough wire slack such that it is very likely that only one run of backend physical design will be required. The drawback of this method is that many hardware solvers will be over-designed since too much slack will have been provided. This may result in an area inflated hardware solver since more registers will have been created than necessary.

Routing congestion is another problem encountered during backend physical design. As part of backend physical design, signals must be routed to different locations within the solver. The signals travel on routing resources, such as fixed wires (as in FPGA targets) or wires that can be created in layers of metal (as in standard cell targets). At any given cycle, a wire can transport one and only one signal. As a result, signals must compete for these routing resources. Routing congestion is the interference of signals as they compete for routing resources. Routing congestion is bad because it can often affect area, timing, and/or power consumption. Designs often have constraints in one or more of these areas, and RTL causing too much routing congestion can cause one or more of the requirements to not be met (e.g. area, timing, power, etc).

The routing congestion problem may be different for difficult backend target technologies. For example, an FPGA is typically composed of a grid of logic blocks connected by fixed routing resources, such as buses, switches, drivers, multiplexers, etc. Each logic block can perform a certain set of functions. Physical design includes logic synthesis and technology mapping, which covert RTL components such as registers and adders into a set of functions, each of which can be run on a logic block. Placement then assigns these functions to the logic blocks such that area is minimized and timing is met. The problem is that if the netlist is too connected, many functions will need to be placed very close together with lots of communication between them. However, there might not be enough routing resources to place these functions close together since there is a fixed amount of routing resources per unit area on the FPGA. Placing these close exhausts all of the routing resources. The placement algorithm must then place the functions further apart so that more routing resources are available. But that 1) makes timing harder because the communications must now travel further, and 2) increases area since the functions are physically spaced further apart.

There are existing techniques to handle wire delay and congestion during backend physical design 106. These include buffer insertion, pipelining, and retiming. Wires with timing and/or congestion problems are typically addressed by adding transport elements 401, 402 (FIG. 4) to the wire. For example, such elements may comprise buffers, which ramp up the signal on the long wire with more current so that the signal can reach its destinations within the clock period. However, adding buffers to the circuit is expensive in terms of area and power.

Another example of transport elements is registers. By placing registers on a net, the signal is broken into two or more signals each which may have more of the clock period available for wire delay. Two well-known techniques can be used for placing registers on nets: retiming and pipelining. Retiming moves existing registers within the circuit to other locations, such as nets in which wire delay is a problem. However, retiming is often not used because of the difficulty of moving registers with initial values across devices (such as multipliers), since determining the new value requires inverting the function of the device—often an impossible task. In addition, retiming is limited since registers cannot be added (or subtracted) to cycles in the circuit. Hence, if a path with a wire delay problem is part of a cycle and requires more registers to compensate for the wire delay than available around the cycle, retiming will not help. Another technique is pipelining, which adds additional registers to the circuit by increasing the latency of the circuit. However, pipelining is often not used since increasing latency changes the circuit's I/O behavior and may not be acceptable for certain designs.

Note that these approaches to handling the wire delay and congestion problems during physical design 106 start with the RTL netlist 105. The mix of functional units in the circuit as well as the schedule of operations, as determined by 104 (or as determined by hand as hardware solvers 105 are also hand designed), is not changed.

To identify nets that will require transport elements 401, 402 during backend physical design 106, large circuits are typically separated in several smaller segments as shown in FIG. 4. The separation is referred to as partitioning, floor planning, or clustering, and the segments are referred to as partitions or clusters. Thus, communications between the hardware components can be viewed as intra-partition communications and inter-partition communications. Partitioning attempts to maximize intra-partition communications and limit inter-partition communications. For purposes of discussion herein, intra-partition connections are defined as local wires and inter-partition connections are defined as global wires. Global wires typically have more wire delay than local wires, since global signals must travel further than local signals.

FIG. 3 depicts the partitioning of the netlist of FIG. 2 into two partitions 301, 302 (bi-partitioning). In FIG. 3, the output terminal 203 and two input terminals 303, 304 are located in one partition 301, while five input terminals 305, 306, 307, 308, 309 are located in the other partition 302. The cost associated with bi-partitioning is referred to as cutsize, which refers to the number of nets 'cut' by the partitioning (the number of inter-partition signals). From FIG. 2, it appears that five connections would be cut, i.e. the connections leading from output terminal 203 to input terminals 305, 306, 307, 308, 309. However, the same value is flowing down each connection, not five different values, since it is one net. Thus, only one net 310 is cut, and the cutsize is one. Note that this view is only depicting the cut for the one net of FIG. 2. Other nets might also be cut, which would be represented as additional connections between the two partitions 301, 302. The total cutsize is the number of nets with terminals in both partitions.

Partitions may also be formed by standard floor-planning techniques, in which the partitions may be organized geometrically. For example, nine partitions could form a 3×3 2-d partition array, where p00 is the upper left partition and p22 is the bottom right partition. The quality of the partitioning could then be based not just on the cutsize of the partitions, but also on the distance that the nets span within the partition array. For example, simulated annealing algorithms evaluate the partitioning in terms of the semiperimeter of each net, which is equal to one-half the perimeter of the bounding box of all terminals covered by the net with the partition array. Transport elements can then be inserted via spanning and/or Steiner trees, which are traditional structures for geometrically distributing a signal while reducing wire length and delay.

BRIEF SUMMARY OF THE INVENTION

One embodiment of the invention is a method for producing a hardware solver for intermediate code comprising analyzing intermediate code for at least one instantiation that may cause at least one of wire delay and congestion in the solver, forming compensation for the at least one instantiation, and forming the solver in accordance with the compensation.

Another embodiment of the invention is a system for producing a hardware solver for intermediate code comprising an evaluator that analyzes the intermediate code for at least one instantiation that may cause at least one of wire delay and congestion in the solver, and forms compensation for the at least one instantiation, and hardware synthesizer that forms the solver in accordance with the compensation.

Another embodiment of the invention is a computer readable medium having computer program logic recorded thereon for producing a hardware solver for intermediate code, the computer program logic comprising logic for analyzing intermediate code for at least one instantiation that may cause at least one of wire delay and congestion in the solver, logic for forming compensation for the at least one instantiation, and logic for forming the solver in accordance with the compensation.

Another embodiment of the invention is an evaluator for enabling the formation of a hardware solver for intermediate code comprising means for analyzing intermediate code for at least one instantiation that may cause at least one of wire delay and congestion in the solver, and means for forming compensation for the at least one instantiation, whereby the solver would be formed in accordance with the compensation.

BRIEF DESCRIPTION OF THE DRAWINGS

FIGS. 7A–7D depict a preferred manner to add delay to cut nets, according to the invention.

FIGS. 9A–9G depict an example of the operation of the invention on a FIR filter kernel with eight operations.

DETAILED DESCRIPTION

Figure 1:
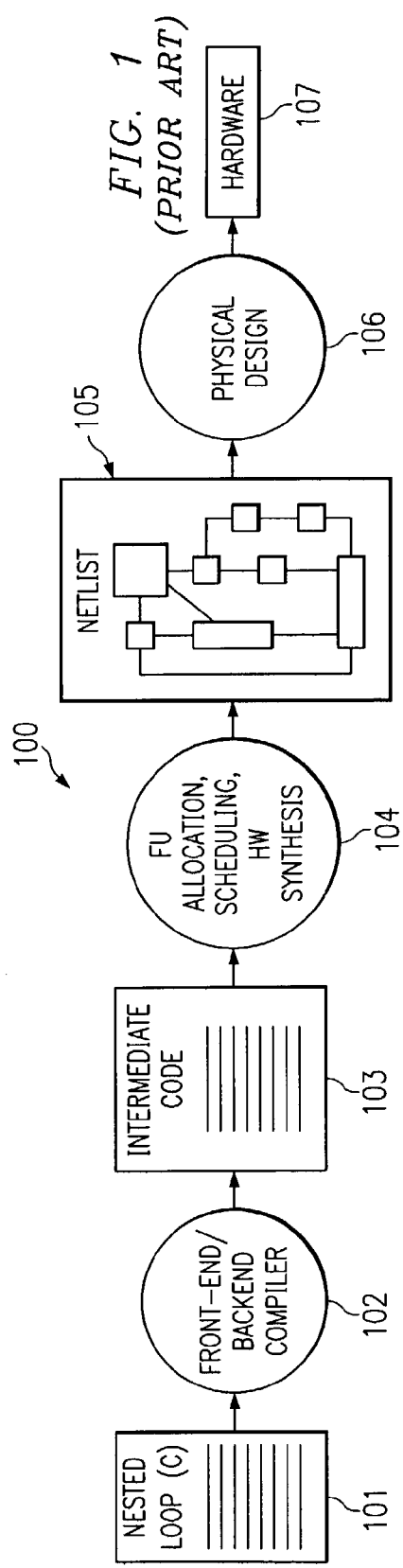
FIG. 1 depicts a flow chart for processing a program into a chip design, according to the prior art.
Figure 2:
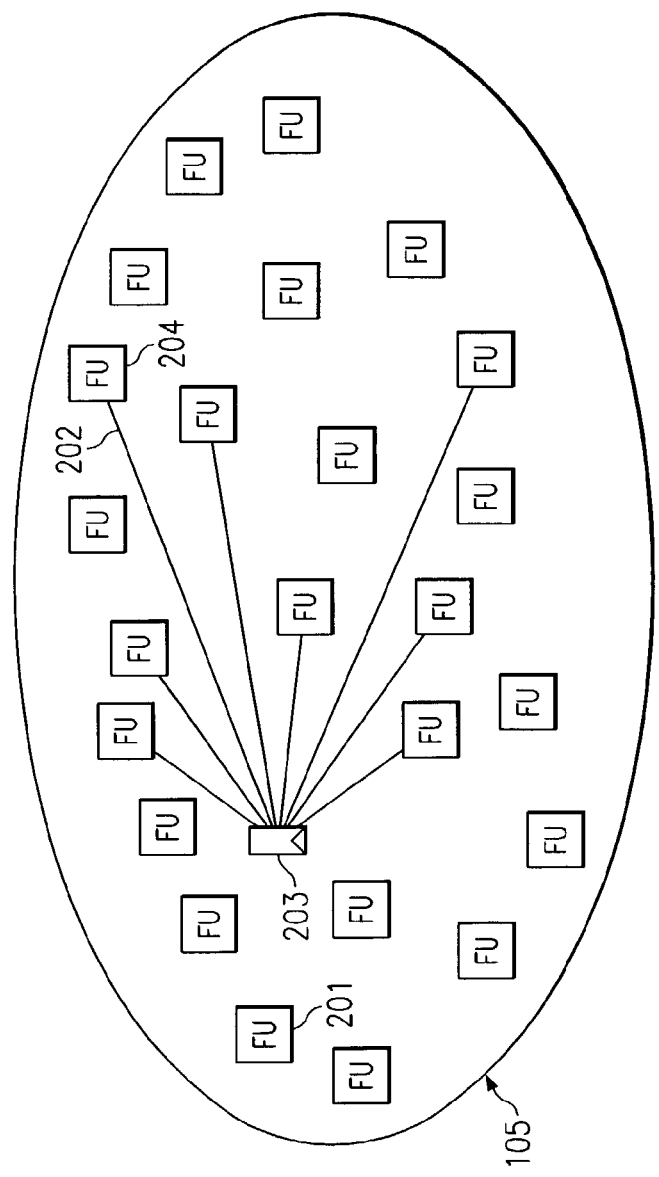
FIG. 2 is an example of a typical netlist.
Figure 3:
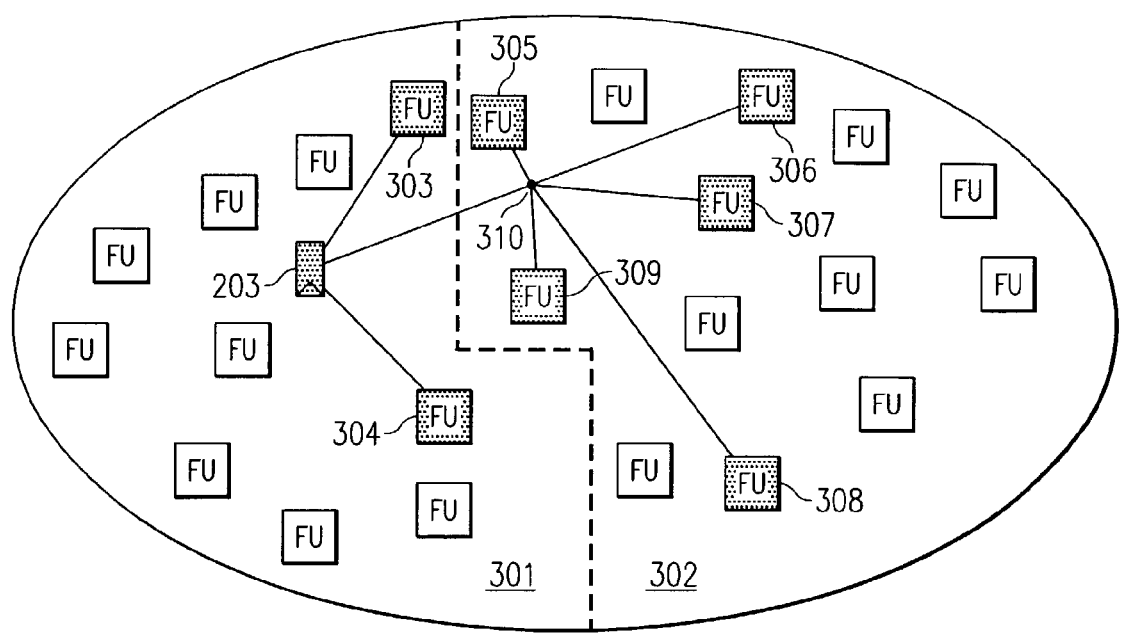
FIG. 3 depicts the partitioning of the netlist of FIG. 2 into two partitions 301, according to the prior art.

An embodiment of the invention is a method for handling routing delay and/or congestion during the automatic synthesis of hardware solvers prior to backend physical design. An embodiment of the invention modifies high-level synthesis to generate a netlist for the logical device that is more amenable to successful physical design and reduces wire delay and/or congestion. Successful physical design involves meeting area and timing requirements within a target technology, such as FPGAs or standard cells. Existing design automation methods handle wire delay by over-designing the hardware solver in order to leave room for wire delay. The amount of the clock period that is left "on the table" for wire delay is called the wiring slack, routing slack, or just slack. The problem is that there is a large variability of wire delay from circuit to circuit, and predicting this can be difficult since the delay of each wire depends on the placement of components and the contention for routing resources during backend physical design. A model netlist is preferably formed from intermediate code and preferably analyzed for instantiations that may affect routing delay and congestion. The analysis leverages backend physical design techniques such as partitioning and/or floorplanning, but preferably occurs prior to hardware allocation and scheduling. An embodiment of the invention then forms compensation for at least one of the instantiations and generates a hardware solver in accordance with the compensation. The resulting hardware solver has a hardware mix and/or an operation schedule that was influenced by compensation designed to reduce routing delay and/or congestion. An embodiment of the invention allows the design automation process to use an aggressive slack target while still making it very likely that only one run of backend physical design will be required.

The invention preferably operates during high-level synthesis prior to and/or during hardware allocation and scheduling. The invention identifies edges in the program graph that would potentially affect wiring delay and/or congestion during physical design. Such an edge typically either has high fan-out in the program graph or has small fan-out but becomes a global connection due to placement constraints during backend physical design. A high fan-out program graph edge typically leads to nets with many terminals in the netlist, which in turn leads to more wiring delay and/or congestion. Although some high fan-out nets can have their terminals placed close together, many cannot. The invention addresses this problem by predicting which edges will become nets that are best suited to have their terminals close to each other (e.g. connected with local wires), and consequently which edges are "problematic" for wiring delay and/or congestion since they are more likely to become global wires during physical design. The invention manages these problematic edges by introducing compensation so that the nets resulting from these edges will be less problematic. One form of compensation has the effect of pipelining the edge—that is, it inserts additional latency along the problematic edges. In the final netlist, this compensation takes the form of registers on the problematic connections.

Figure 5A:
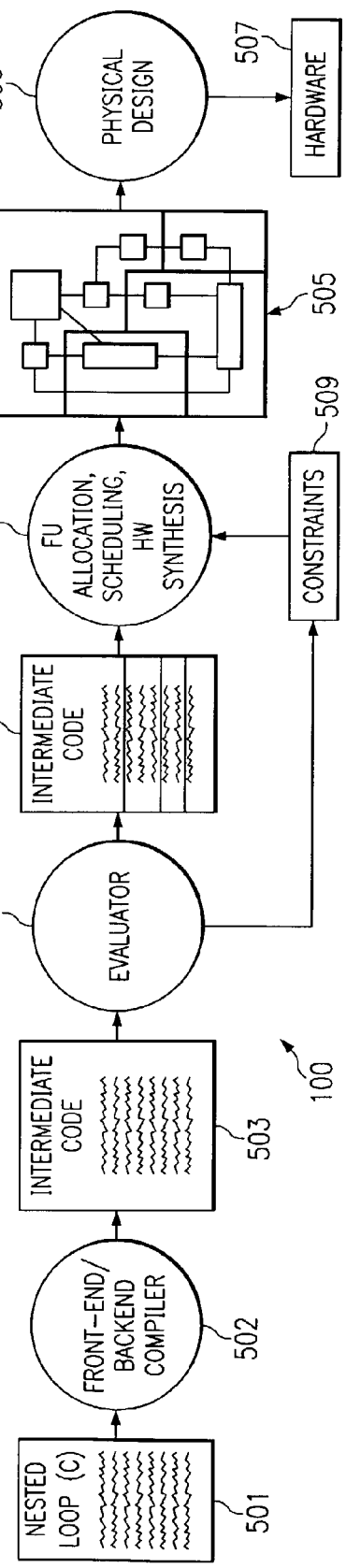
FIGS. 5A and 5B depict block diagrams of an example of an embodiment of the invention.

FIG. 5A depicts a block diagram of an example of an embodiment of the invention. Components 501, 502, and 503 are similar to components 101, 102, and 103 of FIG. 1, respectively. After forming intermediate code 503, the intermediate code is then processed by evaluator 508. The evaluator 508 predicts which dependencies in the code will affect routing delay and/or congestion in the hardware. The evaluator then compensates for these problematic edges by introducing compensation as constraints 509 and/or as modifications of code 503 into code 503-1. One form of compensation has the effect of introducing registers on the problematic connections in order to pipeline the signals. Another form of compensation restricts the sharing of hardware components, such as functional units and registers, in order reduce fan-out and the number of global connections. The FU allocation, scheduling, and hardware synthesis step 504 creates a hardware solver 505 from the compensated code 503-1 and the compensation constraints 509. The resulting netlist is more likely to have success during backend physical design 506.

Figure 5B:
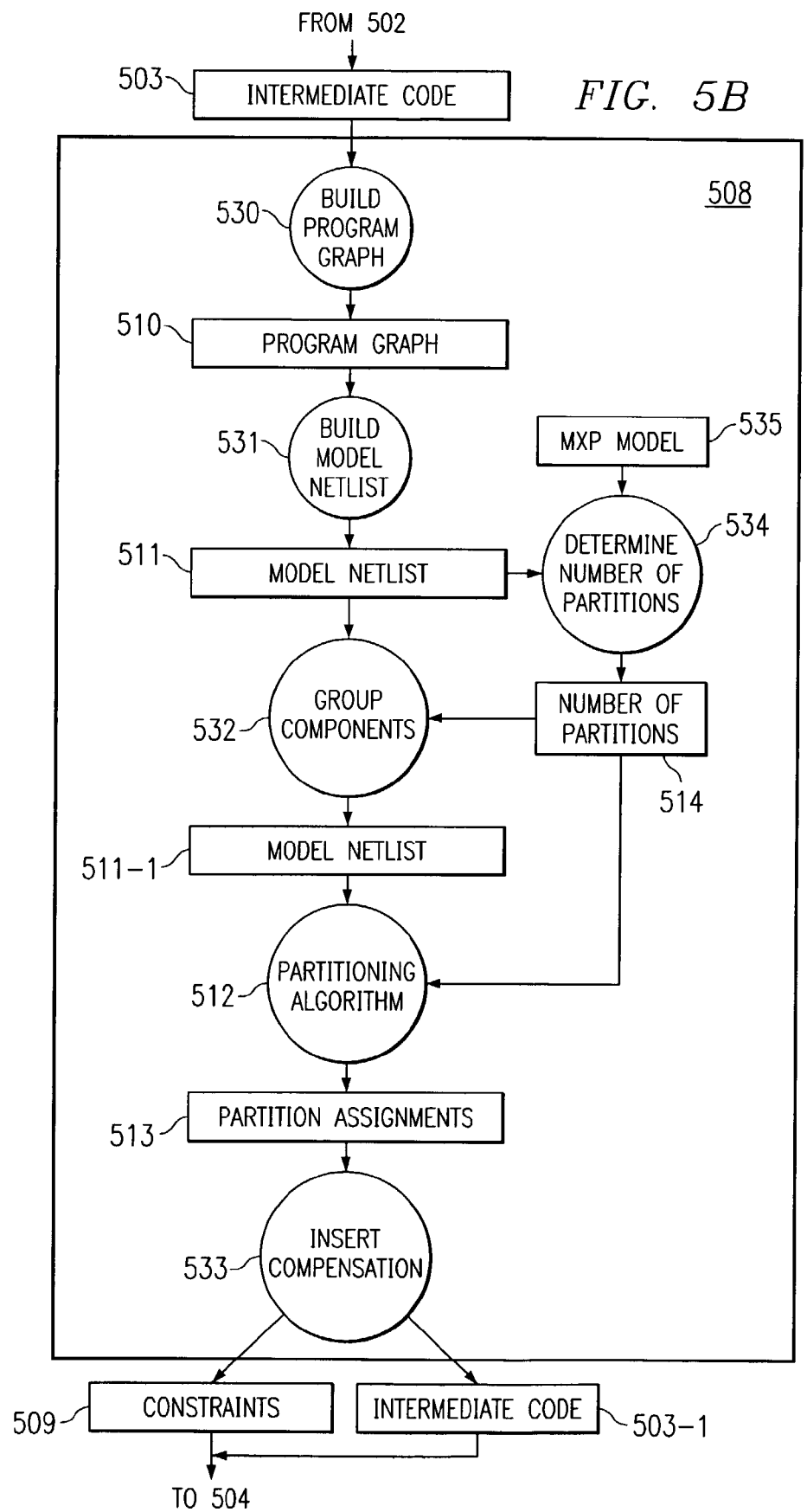

The evaluator 508 is shown in more detail in FIG. 5B. The intermediate code 503 is preferably first converted into a program graph 510. To identify the problematic edges, the program graph is then modeled as a model netlist 511. Components within this model netlist are grouped together 532 to handle issues such as time-multiplexing of expensive functional units and cycles; the result is a modified model netlist 511-1. Node 534 determines the partition organization 514 in preparation for partitioning. Partitioning 512 assigns the components in 511-1 to partitions in 514 in an attempt to minimize inter-partition communications. Based on the partitioning results 512, compensation is inserted at node 533 in the form of constraints 509 on functional unit allocation, scheduling, and synthesis 504 and/or in the form of modifications to the code 503 into the code 503-1.

The invention preferably converts the intermediate code 503 into a program graph that includes nodes and edges, as per prior art. To form the program graph in step 508, each operation in the program becomes a node in the graph. Each flow dependence in the program becomes an edge in the graph. Edges are formed by connecting a node with an operation containing a variable definition (DEF) to all nodes containing an operation that may use that variable's definition (USEs). Well known techniques exist for finding all definition-use (DU) chains in a program. The invention preferably makes one change to the DU-chain analysis for predicated instructions. A predicated instruction has a special operand called a predicate whose value is zero or one and determines whether or not the instruction executes. For each DU-chain from operation X to operation Y in the program, the invention preferably creates an additional DU-chain from the operation that defines the predicate of X to the operation Y. These additional DU-chains allow for a specific type of compensation to be inserted during compensation insertion 533.

Figure 6A:
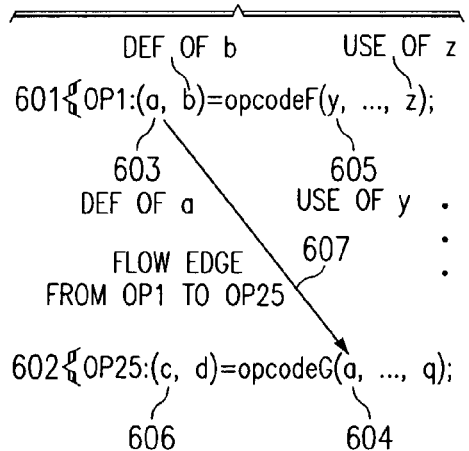
FIGS. 6A–6B depicts a portion of the intermediate code and the associated program graph, according to the invention.

FIG. 6A depicts a portion of the intermediate code 503. The code portion shown in FIG. 6A comprises two instructions or operations, namely OP1 601 and OP25 602. The instructions may comprise the operations of commands on data found in the USE registers. The commands, e.g. opcodeF and opcodeG, may include commands such as move, add, multiple, divide, shift, etc. Each instruction includes definitions (DEFs) of variables, e.g. OP1 601 defines variable a and b 603, and OP25 602 defines variables c and d 606. Each instruction also uses variables as part of its computation (USEs), e.g. OP1 601 uses the contents of variables y to z 605, and OP25 602 uses the contents of variables a to q 604. Thus, OP1 performs opcodeF on the data in variables y to z, and places the results in variables a and b. Note that OP1 601 defines variable a, and OP25 uses variable a. Thus, there is flow dependence 607 of data between OP1 and OP25.

Figure 6B:
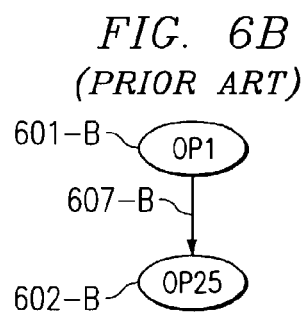
Figure 4:
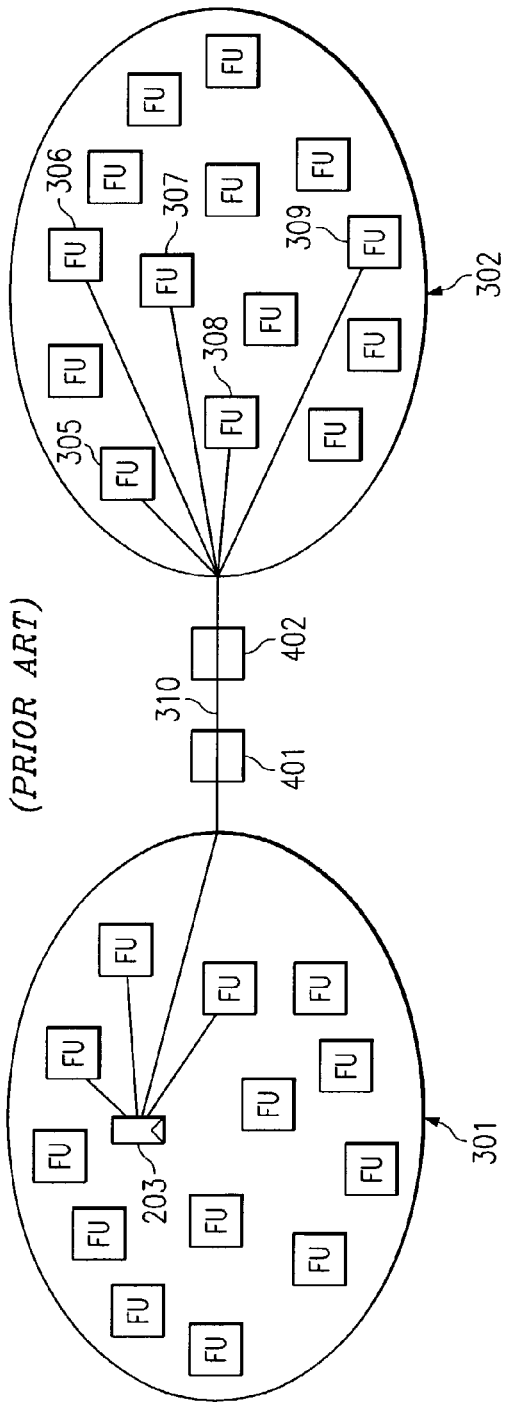
FIG. 4 depicts a different view of the partitions of FIG. 3.

The build program graph node 530 in FIG. 5 converts the intermediate code into a program graph 510. For example, the code in FIG. 6A would be converted into the program graph shown in FIG. 6B. As shown in FIG. 6B, the nodes 601-B and 602-B are the operations, and the edge or connection 607-B between them is the dependence between the operations.

The invention converts the program graph 510 which contains nodes and edges into a model netlist which contains components and nets. The invention will then analyze the model netlist to produce the compensation. Although the model netlist may be created with the aid of FU allocation and/or scheduling, it is not used for the actual FU allocation, scheduling, and synthesis 504. However, the compensation 509 and/or 503-1 generated from the model netlist will influence FU allocation, scheduling, and synthesis 504.

There are several methods for converting a program graph into a model netlist. Note that there is an association between edges of the program graph and nets of the netlist, and there is an association between nodes of the program graph and functional units in the netlist. However, the association may not be 1 to 1 because operations are not functional units, and edges are not nets. For example, a single DEF of a one-bit variable in the intermediate code may result in a plurality of nets in the netlist. This is because the scheduler may schedule the DEF and USEs of a variable at many different cycles, leading to different physical nets. But the scheduler could also schedule all the USEs in the same cycle, leading to a single net. Also, multiple operations may use the same functional unit. For example, in nested loops where the initial interval (II) is greater than one, a single functional unit may be time multiplexed so that multiple operations may be mapped to the same functional unit. Suppose II is four, then a loop iteration, on average, completes every four cycles. Thus, four operations may be mapped onto the same functional unit, e.g. four add operations onto the same adder.

In the preferred approach, a component is created in the model netlist for each node in the program graph. The component selected is preferably the lowest cost functional unit capable of executing the operation. For example, suppose there is an ADD operation in the program graph, and components adder and ALU which both execute ADD. If the adder is cheaper than the ALU, then an adder component is created for the ADD node. Each component is also given a weight that relates closely to the component's area. In a pessimistic view, no sharing ever occurs, and the component weight is just the component area. In a optimistic view, complete sharing occurs, and the component weight is the component area divided by II. A view in between pessimistic and optimistic could be used. The preferred view is to be optimistic where the component weight is the component area divided by II, but to add an II balancing notion to expensive components before and/or during partitioning to guarantee that this optimism is correct. A subsequent step of grouping components 532 will be preferably performed before partitioning to address II balancing.

In the preferred method, a net is created in the model netlist for each DEF in the program graph. Recall that each edge in the program graph connects two operations as a result of a DU-chain. In the model netlist, a net is created from all edges associated with a given DEF. A net connects the component in which the DEF occurs to the components containing the reaching USEs of that DEF.

In the preferred method, each net is weighted according to the bit-width of the variable DEF. The width of the net is used to determine the cost of cutting the net during partitioning step 512. It is possible that an operation defines only X bits of a variable and that some of the USEs of this DEF use W<X of the bits. However, because most programs are such that the DEF width and USE widths are approximately the same, the invention preferably uses the DEF variable width as the net width. Alternative methods are possible, such as gathering the different widths into different sets and creating multiple nets for each DEF depending on how varied the widths are.

The result after the building model netlist step 531 is a model netlist with weighted nets (width) and weighted components (area).

Other methods exist for converting a program graph into a model netlist. For example, each program variable could form a net by connecting all DEFs and all USEs of that variable. Another approach is to make each bit of a variable DEF a net, and then have all nets be of width one.

The invention will operate a partitioning algorithm on the model netlist to form a plurality of partitions. For partitioning to occur, the number of partitions must be determined at node 534. The number of partitions may be calibrated to the physical design tools that will be used to form the final hardware layout. Alternatively, the number of partitions may be based on an estimated area. Another alternative is to try a partition number and if it does not work, then another number is tried.

The invention's preferred manner of determining the number partitions is via calibration of the back end physical design tools. For example, the Mxp model 535 may be used to determine the number of partitions based on the back end tools. This would allow a different number of partitions to be used based on the target technology, e.g. FPGA cells or standard cells. The Mxp model determines the probability "p" of successful one-pass physical design for a circuit of size "M" with wiring slack "x". Assuming that a target probability p and slack x are known as part of the automated synthesis process, the Mxp model can be used to obtain the area M corresponding to that slack and probability. Then, the number of partitions N is the area of the model netlist divided by M.

Thus, a large circuit is broken down into N smaller sub-circuits, each approximately of size M, in which the inter-sub-circuit connections are few and are pipelined. To accomplish this, the invention partitions the model netlist into N partitions, each approximately size M, while minimizing inter-partition communication, and then creates compensation to make sure that the actual hardware solver produced has a similar structure.

During partitioning 512, the invention will move components between different partitions to attempt to minimize the number of cut nets and/or the geometrical distance covered by the nets. The group components node 532 receives a model netlist as input and produces a model netlist as output, in which some of the original components have been grouped together into larger components. Grouping forces components within a group to be in the same partition.

One reason for grouping is to make sure that expensive components can be shared. For II>1 designs, components can be time-multiplexed over many operations. However, after partitioning, node 533 will insert compensation that prevents sharing. Grouping components guarantees that sharing will be possible. In the preferred embodiment, grouping is applied to expensive components since prevention of sharing potentially increases area. For example, if II=2, and the program has two divide operations that can share one functional unit (divide operations are expensive in terms of area and complexity to build as logical units), then these two operations could execute on the same divider component. Thus, the FU allocator will only have to assign one divider functional unit for the two operations. Note that this becomes important as later operations of the invention will run the actual functional unit allocation separately for each partition. Thus, operations that could have shared the same functional unit that are in different partitions will be assigned separate functional units.

The preferred embodiment for grouping expensive components is as follows. Expensive component types are identified. This could be a fixed bound (e.g.>2000 gates) or a percent of the total area of the model netlist (e.g.>5%). In general, this invention prefers to not group less expensive components, even though this might prevent sharing in some cases. Since the components are cheap, the additional area in the final netlist would be small, and the benefit is that the final netlist may be more amenable to physical design. Next, the number of components of each type are found. If sharing is possible, II balancing is performed for each component type. II balancing requires that the minimum number of components without partitioning would be the same as the minimum number of components with partitioning, assuming that sharing across partitions is not allowed. In other words, if N is the number of type X components, and $N_i$ is the number of type X components in partition i, then II balancing requires that sum(over all i) ceil($N_i$/II)=ceil(N/II). For example, let N=8, II=3. Assume three partitions and let N1=3, N2=4, N3=1. Then sum(over all i) ceil($N_i$/II)=ceil(3/3) +ceil(4/3)+ceil(1/3)=4. But ceil(8/3)=3. So this is not balanced. But N1=3, N2=3, N3=2 is balanced since ceil(3/3)+ceil(3/3)+ceil(2/3)=3.

There are several methods to perform II balancing. In the preferred method, a greedy algorithm is used. Each expensive component type is processed from highest to lowest. A partitioning algorithm, such as the one in node 512, is used to search the space of partitions. The best partition that is also II balanced for this type is used to determine the grouping. Components from the current type that have been assigned to the same partition are grouped together. Then the algorithm repeats for the next most expensive component type, but the previous grouping is honored during the partitioning. After all component types have been considered, all expensive components will be grouped such that II balancing is guaranteed. Note that since partitioning produces better results the longer it executes, the partitionings in this step could be fast or slow, depending on the number of expensive types and the amount of compile time available.

Cycles in the program graph may also cause components to be grouped. Computer programs frequently have cycles in the use of variables that constrain how or when certain operations are scheduled. For example, suppose the program graph has OPA which depends on OPB, OPB depends on OPC, and OPC depends on OPA. By looking at the dependencies across iterations, and the II, the scheduling slack around a cycle of operations can be determined. The scheduling slack is the extra number of cycles that can separate dependent operations during scheduling. Cycles in the program graph are always bounded in terms of their available slack. Placing these operations in different partitions may violate scheduling because the compensation insertion at node 533 may reduce the amount of scheduling slack.

The preferred method to handle cycles is to group the components associated with all operations that form a cycle. This can be done by analyzing the program graph and finding all of the strongly connected components (SCCs), as per standard methods. The SCCs of a graph represent all of the cycles in the graph.

Another approach is to handle cycles with slack during partitioning. As part of the cost function of the partitioning, the amount of slack around cycles cut by the partitioning has to be evaluated. No partitioning with a slack less than zero for any cycle will be chosen as the final partitioning.

After grouping is completed a new model netlist is formed in which each group becomes a single component, the weight of the component is the sum of the weights of the components in the group, and any nets that connect to components within a group now connect to the new component. The output of the group components node 532 is a new model netlist 511-1.

The partitioning node 512 applies standard techniques from backend physical design to the model netlist in order to identify local and global nets. For example partitioning/placement/floorplanning assigns netlist components to partitions such that the partitions are relatively area-balanced (the total area of the components within any given partition has a lower bound) and inter-partition communication is minimized. After partitioning, inter-partition nets are treated as the global nets. The program graph edges that correspond to the global nets are tagged as the problematic edges needing compensation.

Given the number of partitions 514 and the model netlist 511-1, the invention performs partitioning 512. More specifically, the invention assigns each component in the model netlist to one of the N partitions 514. The evaluator assigns the components to partitions such that the partition weights (sum of all components in a partition) are balanced between the partitions, such that the partitions are approximately weight balanced. This balancing does not have to be exact, but is preferably maintained within about 10%. The evaluator also assigns the components to partitions such that the cost of the net cuts and/or the geometrical distance covered by the nets is minimized.

The invention can support topological partitioning or geometrical partitioning. For topological partitioning, the invention then preferably uses recursive bi-partitioning to obtain N partitions. Standard algorithms exist to perform bi-partitioning, e.g. KLFM (Kernigham, Lin, Fiduccia, Mattheyses).

For geometric partitioning, the invention preferably uses standard floorplanning techniques. First, the N partitions are organized geometrically. For example, the invention could assume that nine partitions form a 3×3 2-d partition array, where p00 is the upper left partition and p22 is the bottom right partition. Then, quality of the partitioning is based not just on the cutsize of the partitions, but also on the distance that the nets span within the partition geometry. For example, simulated annealing algorithms evaluate the partition in terms of the semiperimeter of each net, which is equal to one-half the perimeter of the bounding box of all terminals covered by the net within the partition array.

Both techniques assign components to partitions while minimizing the number of cut nets and/or the geometrical distance covered by the nets. After completion of partitioning, the invention returns the assignment 513 of components to partitions.

The invention uses the information derived from the partitioning to insert compensation in one or both of two ways. The compensation may be provided to the FU allocation, scheduling, and HW synthesis 504 as constraints 509 upon their operations. The compensation may also be provided by modifying the intermediate code 503 into code 503-1. The compensation may also comprise both a modified intermediate code 503-1 and constraints 509. The intermediate code 503-1 is then processed through functional unit (FU) allocation, scheduling, and hardware (HW) synthesis, subject to the constraints 509 (if any) developed by the evaluator 508. The result is a netlist 505 that represents a register-level view of the hardware solver and has the functionality of the program 101 and in addition has the properties of the compensation 509/503-1.

This invention preferably introduces one or both of two forms of compensation to deal with routing delay and/or congestion. Type 1 compensation has the effect of introducing registers on the inter-partition connections in order to pipeline the signals. Type 2 compensation restricts the sharing of hardware components, such as functional units and registers, in order to reduce fan-out, congestion, and the number of global connections.

The invention preferably introduces type 1 compensation so that each cut net in the model netlist will become at least two nets in the physical netlist. These two physical nets will be connected by one or more registers. To create this compensation, the invention preferably inserts one or more explicit MOVE operations into the program. For example, a cut net has a single DEF and zero or more USEs in one partition and one or more USEs in the other partitions. The USEs outside of the partition containing the DEF of the net are removed from the net, and replaced by USEs from one or more MOVE operations, which will take at least one cycle in the schedule. (Note that if zero cycle MOVE operations exist, then these inserted MOVE ops should be distinguished from the zero cycle MOVE ops during scheduling.) The MOVE operations can be connected to each other to provide a pipeline of nets, which will become a pipeline of registers in the physical netlist.

Figure 7A:
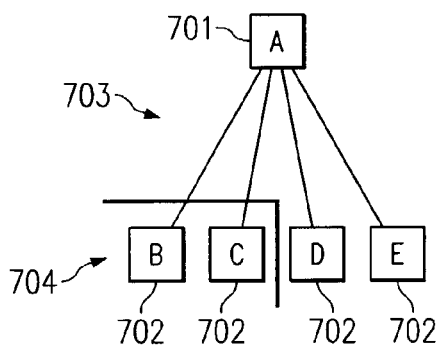

FIGS. 7A–7D depict a preferred manner to add delay to cut nets. FIGS. 7A and 7B involve the insertion of a move operation into the program graph and hence the intermediate code 503-1. Note that this assumes that a move would require at least one cycle of operation and would add at least one register to the modified netlist. Thus, the insertion of moves adds delay to the model netlist and the resulting physical netlist 505.

Figure 7C:
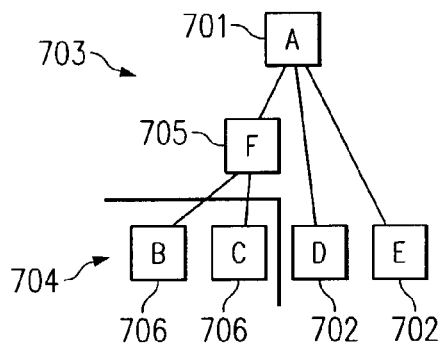

FIG. 7A depicts a program graph for the intermediate code of FIG. 7B. Note that there are five DEFs, namely A, B, C, D, and E, which would mean that there are 5 nets, however only the net for DEF A 701 is shown for the sake of simplicity. DEF A has four USEs 702, namely B, C, D, and E. Two of the USEs are in one partition along with DEF A, namely D and E, and the other two are in another partition 704, namely B and C. FIG. 7C depicts the insertion of a move operation F 705 into the program graph and the intermediate code. Thus, F becomes a USE of A, and B and C become USEs 706 of F. Thus, the insertion of F provides at least one cycle of delay, which essentially pipelines the data from between the partitions.

Alternative methods for providing type 1 compensation exist. For example, type 1 compensation could take the form of constraints 509 on the scheduler 504. It could require that the scheduler increase the earliest start time of operations which use a value that was produced in a different partition. The amount of the increase would correspond to the desired inter-partition delay. The constraints 509 may also indicate that HW synthesizer must insert the required delay on cut connections, as determined from the partitioning of the model netlist.

For an example of type 1 compensation, consider a program graph DEF with eight USEs, the DEF and four of the USEs in one partition "A," and the other four USEs in the other partition "B." Without compensation this DEF may become a single net in the hardware solver with nine terminals: five in partition "A" and four in partition "B". With the compensation, this program edge becomes at least two nets in the hardware solver: one or more to connect the five partition "A" components and the move component, and one or more to connect the four partition "B" terminals and the move component. The registers resulting from the MOVE operations add delay to the signal transmission between partitions. Thus, the signal is pipelined between partitions. The compensation guarantees that this pipelining will be built into the final netlist. Thus, what could have been a net with excessive wire delay is replaced by one or more nets with less delay which comprise the pipeline stages across the partition boundaries.

For geometrical partitioning, the invention can insert different types of type 1 compensation for nets that span multiple partitions. For example, many move operations could be created that form a spanning and/or Steiner tree to connect the USEs. Spanning and Steiner trees are traditional structures for geometrically distributing a signal while reducing wire length and delay.

Because type 1 compensation adds registers along problematic connections, timing convergence is made easier during physical design, and the circuit may not require additional buffers and/or registers to be inserted into the wires during physical design. Note that because the compensation is inserted prior to scheduling, the invention may result in a different netlist than applying pipelining and retiming to an existing netlist. The resulting netlist from the invention may have a different functional unit mix and operation binding than a netlist having pipelining and retiming applied to the netlist created without type 1 compensation.

The type 2 compensation reduces wire delay and congestion by restricting the sharing of resources in order to make the resulting hardware solver's communication less centralized and more distributed. Centralized communication lead to more wire congestion. In the preferred method, type 2 compensation takes the form of constraints 509. The constraints cause FU allocation to be performed for each partition independent from FU allocation for the other partitions. During scheduling, the alternative lists for each operation are restricted to the functional unit within the operation's partition. This prevents two operations that are deemed to be far apart in the model netlist (e.g. they are in different partitions) from sharing the same functional unit hardware in the physical netlist.

For example, consider the two operations: z=x+y; w=z*r in one partition and two operations: a=b+c; g=a/d in another. If the+operations share the same adder functional unit, then that adder must be connected to the multiplier that z*r gets mapped to as well as the divider that aid gets mapped to. Hence, the result of the adder must be connected to both partitions, which would potentially require more routing delay than had this particular sharing been disallowed. In addition, the placement algorithm will prefer to place the adder, multiplier, and divider close together, which could lead to routing congestion.

Another form of type 2 compensation prevents sharing of storage for data. In the preferred method, the code is modified such that every variable is uniquely renamed in each partition. This code change prevents storage synthesis from trying to use the same storage structure for a given variable. The invention preferably handles predicated operations in the following way. If a variable has multiple definitions under mutual exclusive predicates, definitions reaching a use in another partition are preferably merged in the partition containing the USE. The extensions to the DU-chain generation during program graph creation 508 causes the predicates of all reaching definitions for a given use to be in the same partition. As a result, the operands required to perform the merge are available in the partition. In the preferred method, the merge is done by inserting multiple predicated MOVE operations into the code 503-1.

Another approach for type 2 compensation is to add constraints to 509 that prevent storage synthesis from allowing variables in different partitions from sharing the same storage structures.

The result of the invention is a netlist 505 that is more amenable to physical design. In particular, the resulting hardware solver has a hardware mix and an operation schedule that was influenced by compensation designed to reduce wire delay and/or congestion. This invention allows a timing-driven scheduler to use an aggressive slack target while still making it very likely that only one run of backend physical design will be required.

FIGS. 9A–9G depict a section of code being operated upon by the embodiment of the invention in FIGS. 5A–5B.

FIG. 9A depicts the intermediate code for a FIR filter kernel with 8 operations, including a branch OP275, two adds OP62 OP75, one move OP100, two loads OP107 OP114, a multiply-add OP128, and a store OP153. There are 7 variables, numbered 218, 2, 3, 5, 6, 7, and 128. Note that the notation var_num[1] is a reference to the variable from a prior iteration and will also cause data dependencies. The target performance is given as II=2.

FIG. 9B depicts a program graph 902 created by node 530 on code 901. For each node the program graph, the USEs are listed on the first line, the OP is listed on the second line, and the DEFs (if any) are listed on the third line. The widths of the operands are also provided.

Figure 9C:
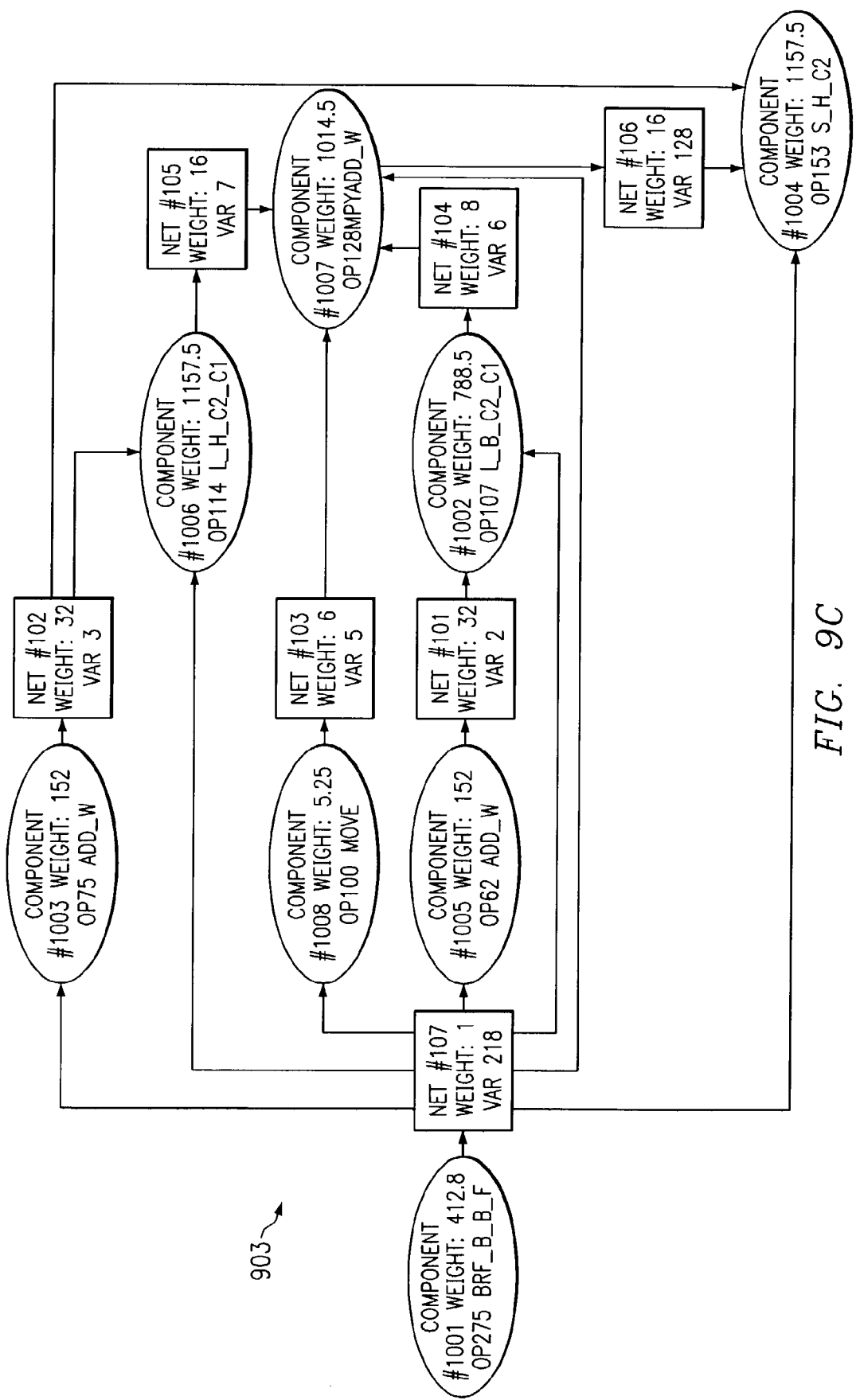

FIG. 9C depicts a model netlist 903 created by node 531 from program graph 902. For each component, the weight (e.g. area) is listed as well as the operations that are part of the component. For each net, the weight (e.g. width) is listed as well as the variables that are defined by the net. For example, component 1003 has a weight of 152, was created from the add operation 75, and is connected to net 102 that has a weight of 32 and was created from the variable 3.

Figure 9D:
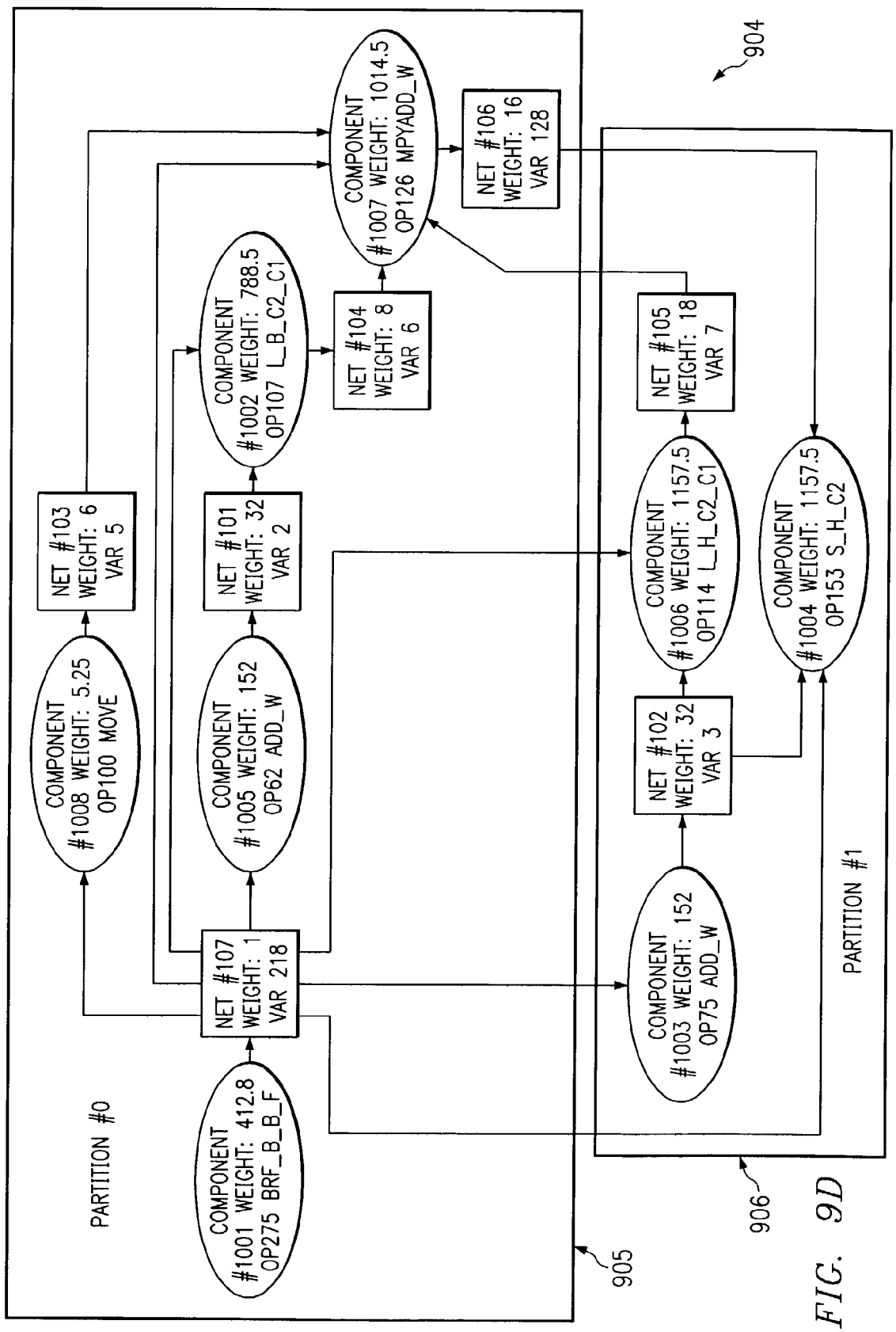

FIG. 9D depicts a bi-partitioning 904 which is created by node 512 from model netlist 903, assuming that no components were grouped by node 532. Two partitions 905 and 906 are formed. The cutsize is the total weight of the nets cut by the partitioning. In this case, the nets that are cut by 905 and 906 are net 107 (weight 1), net 105 (weight 16), and net 106 (weight 16), yielding a cutsize of 33.

Figure 9E:
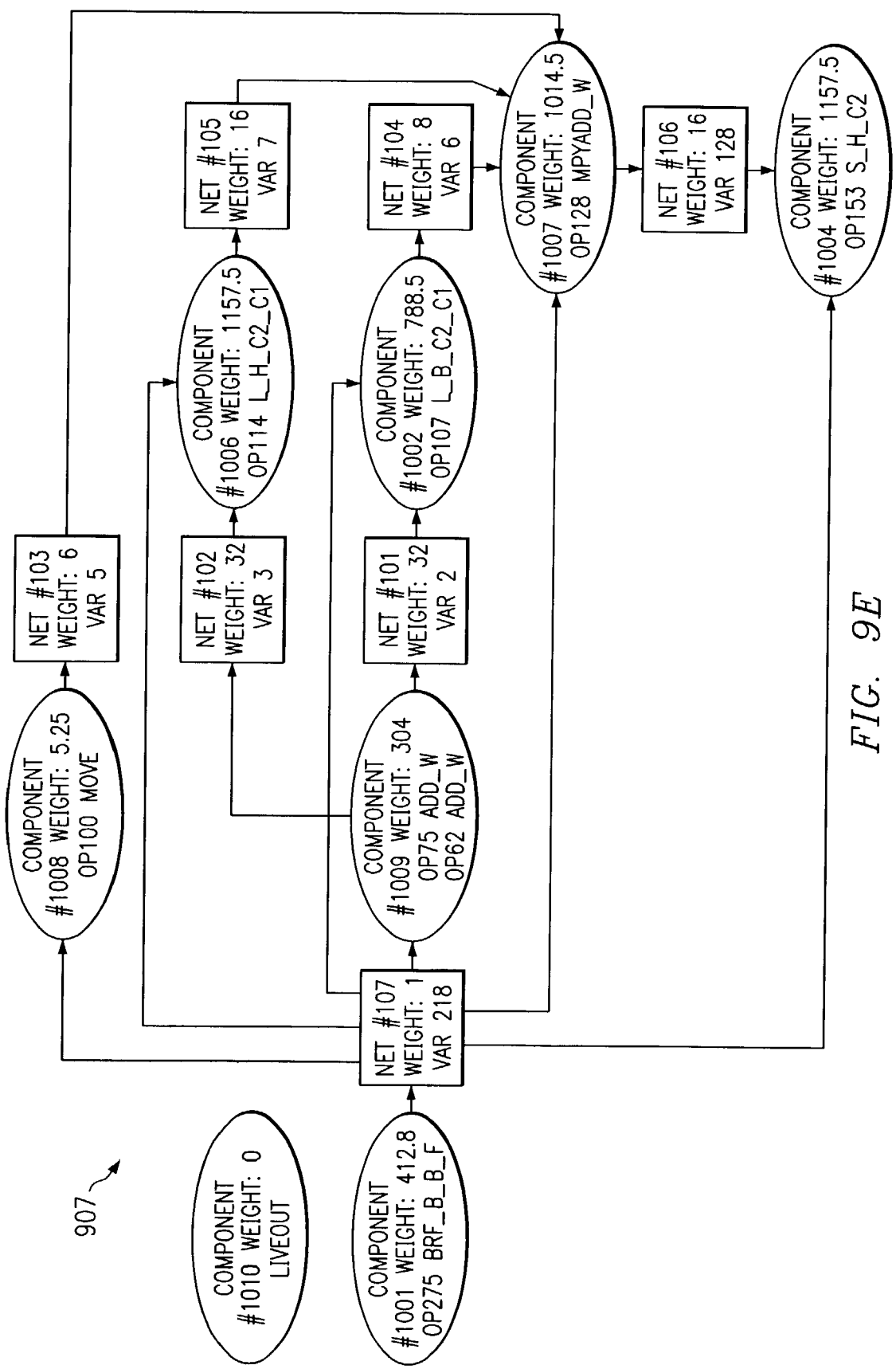

FIG. 9E depicts the netlist after the group components node 532. For simplicity, the example of FIG. 9E depicts the operation of this node only with respect to II balancing of adder components. The model netlist 903 has two adder components: 1005 and 1003, each with a weight of 152. Suppose that it determines that these are expensive components. Since II=2, they are grouped together by step 532. The resulting model netlist 907 is shown in FIG. 9E. Note that components 1005 and 1003 from model netlist 903 have been replaced by component 1009 in model netlist 907. The weight of the new component 1009 is 304, and it connects to nets 107, 102 and 103.

Figure 9F:
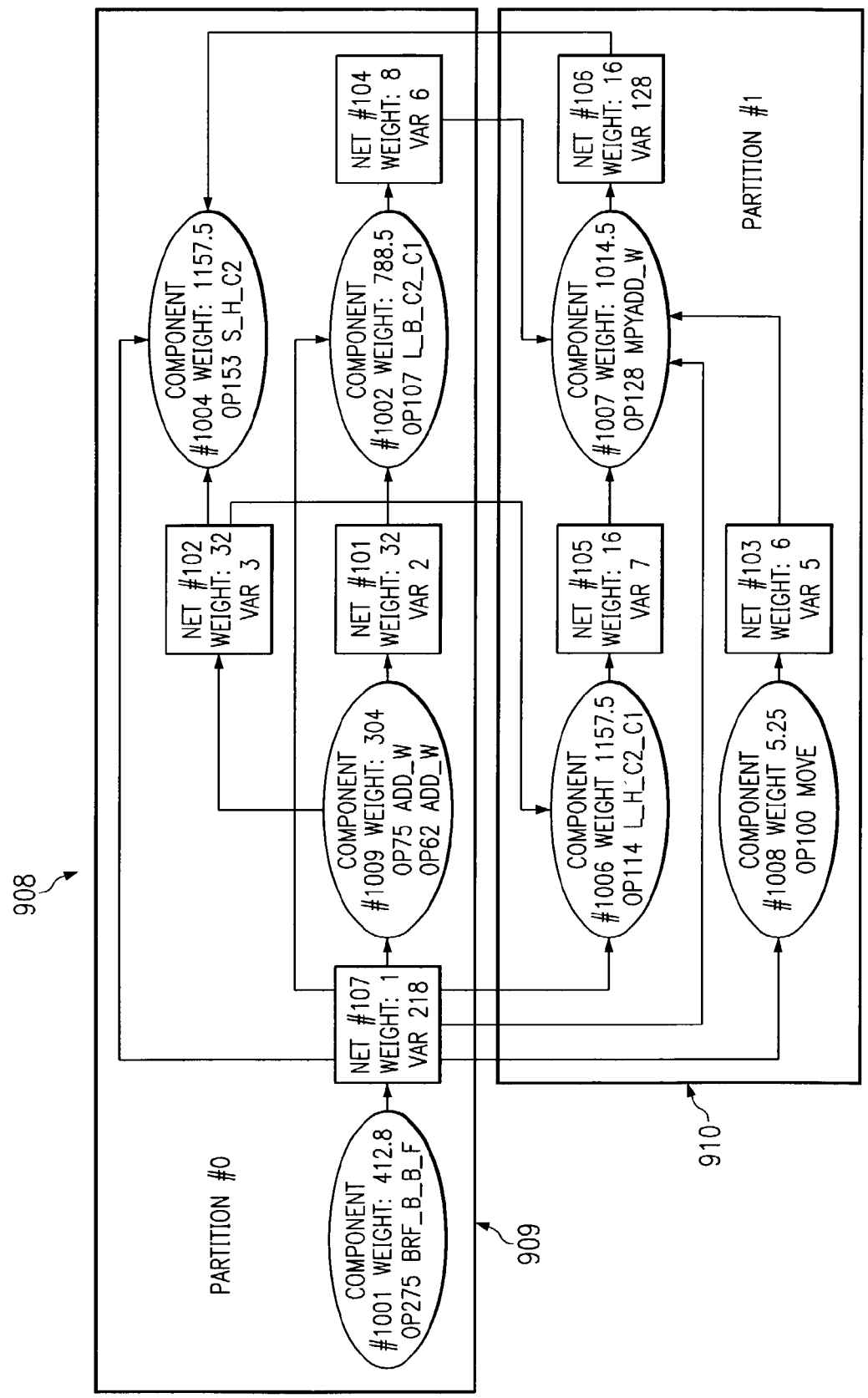

FIG. 9F depicts a bi-partitioning 908 created by node 512 from model netlist 907. Two partitions 909 and 910 are formed. Note that the two add operations 75 62 are now in the same partition 909, whereas without the grouping step they were in different partitions as shown in FIG. 9D. Hence, the adds will be able to share the same hardware in partitioning 908, whereas two adders would have been required for partitioning 904. However, the cutsize of partitioning 908 has now increased to 57 (nets 107, 102, 104, and 106 are cut with weights of 1, 32, 8, and 16 respectively) because of the grouping.

Figures 1, 9G:
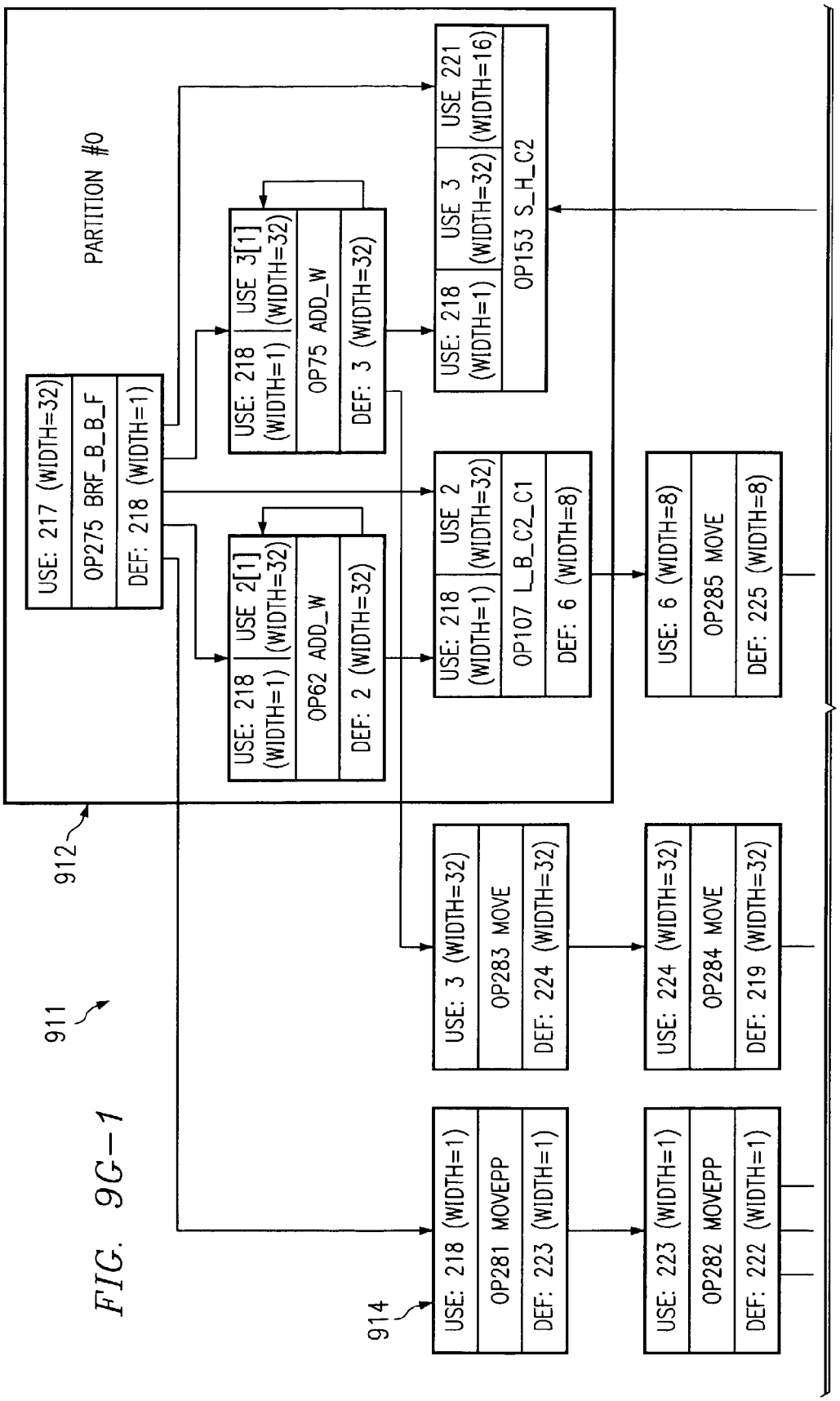

FIG. 9G depicts the program graph 911 of the code formed by node 533 on the partitioning of 908. The first form of compensation is the constraints on FU allocation and scheduling. The operations are grouped into partitions 912 and 913. Functional unit allocation will occur on each partition independent of the other. In addition, scheduling will be constrained to only map operations to functional units from the corresponding partition. Another form of compensation is the MOVE operations. In this example, two move operations were added on each cut net. For example, the predicate variable 218 is moved from partition 912 to partition 913 via the predicate move operations OP281 and OP282. Note that the fan-out of 218 has been reduced, which may reduce wire delay. In the original program graph 902, the fan-out of variable 218 was 7. In the post-compensation program graph 911, the fan-out of 218 is 5. The three other USEs of 218 in 902 are now driven by the new predicate variable 222 in 911. In addition to reducing fan-out, the compensation causes the final netlist to have small sized sub-circuits. These can be identified as partitions 912 and 913 in FIG. 9G. Each of these partitions will have their own functional unit allocation, and hence will become their own sub-circuits. In addition, the moves between partitions will become registers, so backend physical design will have the flexibility of placing these partitions far apart while still meeting timing.

When implemented in software, the elements of the present invention are essentially the code segments to perform the necessary tasks. The program or code segments can be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

Figure 8:
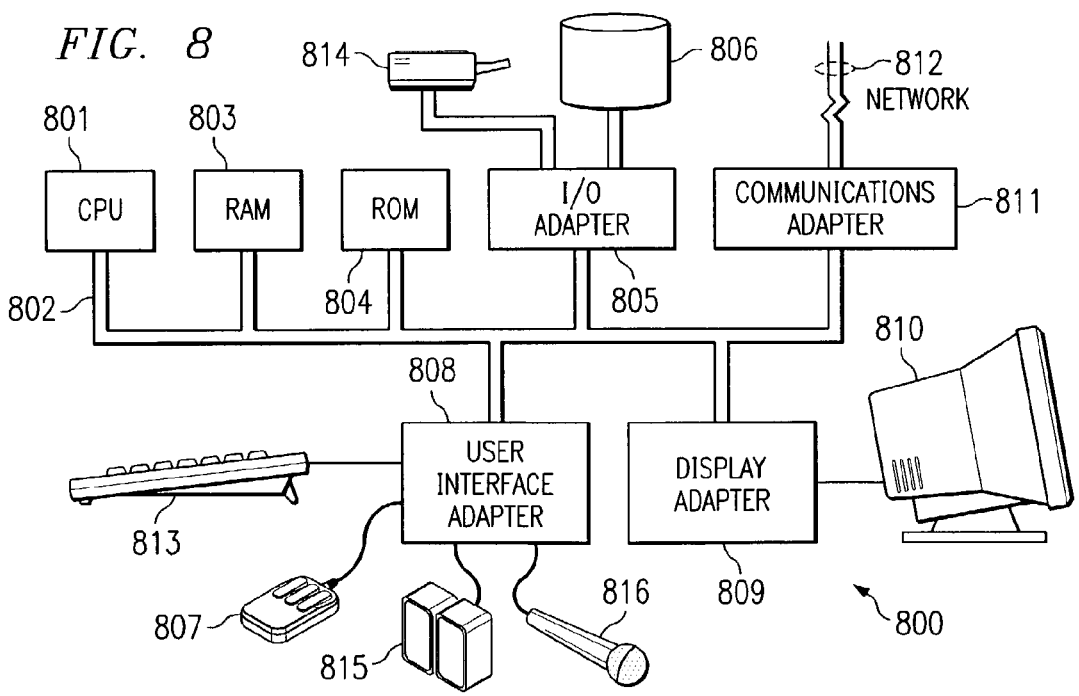
FIG. 8 depicts a block diagram of a computer system which is adapted to use the present invention.

FIG. 8 illustrates computer system 800 adapted to use the present invention. Central processing unit (CPU) 801 is coupled to system bus 802. The CPU 801 may be any general purpose CPU, such as an HP PA-8500 or Intel Pentium processor. However, the present invention is not restricted by the architecture of CPU 801 as long as CPU 801 supports the inventive operations as described herein. Bus 802 is coupled to random access memory (RAM) 803, which may be SRAM, DRAM, or SDRAM. ROM 804 is also coupled to bus 802, which may be PROM, EPROM, or EEPROM. RAM 803 and ROM 804 hold user and system data and programs as is well known in the art.

Bus 802 is also coupled to input/output (I/O) controller card 805, communications adapter card 811, user interface card 808, and display card 809. The I/O adapter card 805 connects to storage devices 806, such as one or more of a hard drive, a CD drive, a floppy disk drive, a tape drive, to the computer system. The I/O adapter 805 is also connected to printer 814, which would allow the system to print paper copies of information such as document, photographs, articles, etc. Note that the printer may a printer (e.g. dot matrix, laser, etc.), a fax machine, or a copier machine. Communications card 811 is adapted to couple the computer system 800 to a network 812, which may be one or more of a telephone network, a local (LAN) and/or a wide-area (WAN) network, an Ethernet network, and/or the Internet network. User interface card 808 couples user input devices, such as keyboard 813, pointing device 807, and microphone 816, to the computer system 800. User interface card 808 also provides sound output to a user via speaker(s) 815. The display card 809 is driven by CPU 801 to control the display on display device 810.

What is claimed is:

1. A method for producing a hardware solver for intermediate code comprising:

analyzing intermediate code for at least one instantiation that may cause at least one of wire delay and congestion in the solver;

forming compensation for the at least one instantiation, wherein the compensation prevents a potential sharing of hardware resources from occurring; and forming the solver after forming said compensation, said forming the solver comprising scheduling operations of the intermediate code in accordance with the compensation.

2. The method of claim 1, wherein the analyzing comprises: grouping operations of the intermediate code into a plurality of disjoint sets.

3. The method of claim 2, wherein the instantiation is selected from the group consisting of: two operations in different sets that potentially execute on the same functional unit; and two items of data in different sets that potentially share the same storage.

4. The method of claim 3, wherein the compensation comprises: repeating functional unit allocation at least once per set; wherein an operation can only be bound to a functional unit within their set.

5. The method of claim 3, wherein compensation comprises:

disallowing the sharing of storage for values in different sets.

6. The method of claim 5, wherein the disallowing comprises:

handling a variable accessed in more than one set by assigning the variable to a plurality of disjoint storage structures, with one assignment per set in which the variable is accessed.

7. The method of claim 5, wherein the disallowing comprises:

handling a variable accessed in more than one set by modifying the intermediate code to have uniquely named variables from each set.

8. The method of claim 1, wherein analyzing comprises: forming a model netlist from the intermediate code; wherein the model netlist comprises a plurality of nets.

9. The method of claim 8, wherein forming the model netlist comprises: forming a program graph from the intermediate code; and forming the model netlist from the program graph.

10. The method of claim 8, wherein analyzing further comprises:

partitioning the model netlist into a plurality of partitions; and determining at least one net that is cut by the partitioning.

11. The method of claim 10, wherein: the instantiation is a net that may become a global wire which connects to two partitions; and the compensation causes registers to be formed in the solver that corresponds to the global wire.

12. The method of claim 10, further comprising: adding compensation to the cut net.

13. The method of claim 12, wherein: compensation causes the cut net to become at least two nets in the solver connected with at least one register.

14. The method of claim 13, further comprising: inserting at least one move into the intermediate code to cause the cut net to become at least two nets.

15. The method of claim 10, wherein: compensation causes functional unit allocation for each partition to be independent from any other partition.

16. The method of claim 10, wherein the plurality of partitions is a number based upon a tool used to design the solver.

17. The method of claim 10, wherein the analyzing further comprises:

determining a cost of the cut net.

18. The method of claim 17, wherein: the cost is a width of a variable associated with the net.

19. The method of claim 17, further comprising: determining a distance between two partitions of the plurality of partitions.

20. The method of claim 19, wherein the determining the cost comprises: determining the cost of the cut net based on the distance.

21. The method of claim 20, wherein determining the cost of the cut net based on the distance comprises: determining the semiperimeter of the cut net.

22. The method of claim 10, wherein analyzing further comprises:
determining a value associated with an area of each partition.

23. The method of claim 10, wherein partitioning comprises:
assigning components to partitions.

24. The method of claim 1, wherein analyzing comprises: performing dataflow analysis on the intermediate code.

25. The method of claim 24, wherein: the instantiation is formed from a variable definition that has many uses as compared to another variable definition.

26. The method of claim 25, wherein: the compensation causes placement of at least one move operation to reduce the number of uses for the variable definition.

27. The method of claim 1, wherein the forming the solver comprises:
modifying the intermediate code with the compensation;
forming the solver with the modified intermediate code.

28. The method of claim 1, wherein the forming the solver comprises:
forming at least one constraint with the compensation;
forming the solver with the intermediate code according to the at least one constraint.

29. The method of claim 1, wherein the forming the solver comprises:
modifying the intermediate code with the compensation;
forming at least one constraint with the compensation;
forming the solver with the modified intermediate code according to the at least one constraint.

30. The method according to claim 1 wherein said evaluating the intermediate code comprises converting the intermediate code into a model netlist having a functional unit corresponding to each operation of the intermediate code.

31. The method according to claim 30 wherein said evaluating the intermediate code further comprises partitioning the model netlist.

32. The method according to claim 31 wherein said partitioning the model netlist comprises determining a number of partitions and grouping functional units into the partitions.

33. The method according to claim 32 wherein functional units are grouped in order of area and complexity.

34. A system for producing a hardware solver for intermediate code comprising:
an evaluator that analyzes the intermediate code for at least one instantiation that may cause at least one of wire delay and congestion in the solver, and forms compensation for the at least one instantiation, wherein the compensation prevents a potential sharing of hardware resources from occuring; and
hardware synthesizer that forms the solver after forming the compensation including scheduling operations of the intermediate code in accordance with the compensation.

35. The system of claim 34, wherein evaluator forms a model netlist from the intermediate code; wherein the model netlist comprises a plurality of virtual nets.

36. The system of claim 35, wherein the evaluator forms a program graph from the intermediate code, and forms the model netlist from the program graph.

37. The system of claim 35, wherein the evaluator partitions the model netlist into a plurality of partitions, and determines at least one net that is cut by the partitioning.

38. The system of claim 37, wherein the instantiation is a net that may become a global wire which connects to two partitions, and the compensation causes registers to be formed in the solver that correspond to the global wire.

39. The system of claim 34, wherein evaluator performs dataflow analysis on the intermediate code.

40. The system of claim 39, wherein the instantiation is formed from a variable definition that has many uses as compared to another variable definition.

41. The system of claim 32, wherein the compensation causes placement of at least one move operation to reduce the number of uses for the variable definition.

42. The system of claim 34, wherein the evaluator modifies the intermediate code with the compensation, and the hardware synthesizer forms the solver with the modified intermediate code.

43. The system of claim 34, wherein the evaluator forms at least one constraint with the compensation, and the hardware synthesizer forms the solver with the intermediate code according to the at least one constraint.

44. The system of claim 34, wherein the evaluator modifies the intermediate code with the compensation and forms at least one constraint with the compensation, and the hardware synthesizer forms the solver with the modified intermediate code according to the at least one constraint.

45. A computer readable medium having computer program logic recorded thereon for producing a hardware solver for intermediate code, the computer program logic comprising: logic for analyzing intermediate code for at least one instantiation that may cause at least one of wire delay and congestion in the solver; logic for forming compensation for the at least one instantiation, wherein the compensation prevents a potential sharing of hardware resources from occuring; and logic for forming the solver after forming said compensation, said forming the solver comprising scheduling operations of the intermediate code in accordance with the compensation.

46. A system comprising an evaluator for enabling the formation of a hardware solver comprising: means for converting intermediate code into a model netlist having a functional unit corresponding to each operation of the intermediate code; means for partitioning the model netlist; and means for forming compensation that prevents a potential sharing of functional units from occuring.

47. The system according to claim 46 further comprising means for scheduling operations of the intermediate code in accordance with the compensation, wherein the scheduling is performed after the compensation is formed.

* * * * *